United States Patent [19]
Fierkens

[11] Patent Number: 5,531,014
[45] Date of Patent: Jul. 2, 1996

[54] ELECTROMECHANICAL PRESS AND METHOD OF OPERATING

[76] Inventor: Richard H. J. Fierkens, Keurbeek 15, 6914 AE Herwen, Netherlands

[21] Appl. No.: 316,131

[22] Filed: Sep. 30, 1994

Related U.S. Application Data

[63] Continuation-in-part of Ser. No. 162,716, Dec. 6, 1993.

[51] Int. Cl.$^6$ ................................................ B23P 23/00
[52] U.S. Cl. ................................. 29/566.3; 72/421
[58] Field of Search ........................ 29/566.3, 34 D; 72/405, 421; 83/929.2; 140/105

[56] References Cited

U.S. PATENT DOCUMENTS

| | | | |
|---|---|---|---|
| 3,914,977 | 10/1975 | Rimmer | 72/421 |
| 4,540,087 | 9/1985 | Mizumoto | 72/421 |
| 4,885,837 | 12/1989 | Eshima | 29/827 |
| 5,199,469 | 4/1993 | Ishihara | 72/37 |
| 5,335,702 | 8/1994 | Goto | 140/105 |

*Primary Examiner*—P. W. Echols
*Attorney, Agent, or Firm*—Harry M. Weiss; Jeffrey D. Moy; Harry M. Weiss & Associates

[57] ABSTRACT

An electromechanical press apparatus for trimming excess portions from a leadframe strip package having a semiconductor chip thereon and for forming leads of the leadframe strip package extending from the semiconductor chip is disclosed. The apparatus provides an electric motor that drives two orthogonally oriented shafts through a 90 degree gear box coupler. One shaft is used to move a portion-of the apparatus along a rectangular path of motion for linearly shifting a leadframe strip along a plane orthogonally oriented to the rectangular path of motion. The other shaft is used to move another portion of the apparatus along a line of motion orthogonally oriented to the plane for performing a trimming operation or a forming operation. The electric motor is provided with an internal clutch mechanism that is selectively engaged by external control signals in order to cause the motion of the leadframe strip to be synchronized with the motion required to perform the desired trimming or forming operation on the leadframe strip.

20 Claims, 4 Drawing Sheets fig. 1 fig. 2 fig. 3 fig. 4 fig. 5 fig. 6 fig. 7 fig. 8

ELECTROMECHANICAL PRESS AND METHOD OF OPERATING

RELATED APPLICATION

This patent application is related to the patent application Ser. No. 08/162,717 entitled "MODULAR ELECTROMECHANICAL PRESS AND METHOD THEREFOR" filed Dec. 6, 1993 in the name of the same inventor, and is incorporated herein by reference. This patent application is also a continuation-in-part of patent application Ser. No. 08/162,716 entitled "AN ELECTROMECHANICAL PRESS AND METHOD THEREFOR" filed Dec. 6, 1993 in the name of the same inventor.

BACKGROUND OF THE INVENTION

1. Field of the Invention

This invention relates generally to press apparatus and, more specifically, to an electromechanical press apparatus and method therefor that provides synchronized motion of a leadframe strip with motion of equipment for performing trimming or forming operations on the leadframe strip in a minimally sized press unit.

2. Description of the Related Art

Today, manufacturers are moving toward smaller, more compact machinery in order to reduce the size and cost of their manufacturing facilities. In the semiconductor industry, there has been a shift toward reducing the size of the various machines that perform such functions as wire bonding, plastic molding, post mold curing, dambar cutting, trimming, and forming. To further reduce the size of a semiconductor manufacturing facility, the trend has been to not only reduce the size of the production machinery but also to build machines in a modular manner that allows the machines to be quickly and easily coupled together in an in-line fashion.

With respect to the trimming and forming operations associated with semiconductor production, in general, there are two major steps in the process—moving the leadframe strip into position and performing the trimming or forming stroke. Combining machinery that can both move a leadframe strip into position and perform the trimming or forming operation into a unit of sufficiently small size without losing press power is a challenging problem. Prior art press type machines used for trimming and forming semiconductor packages have not been capable of providing sufficient power in a unit of sufficiently small size. Some prior art press units have employed hydraulic presses in an effort to maximize press power while minimizing the size of the unit. However, hydraulic presses are problematic for use in the clean room environment that is generally associated with the production of semiconductor packages. Therefore, there existed a need to provide an electromechanical type press used for trimming and forming semiconductor packages and their associated leadframe strips that provides maximum press power per unit volume of the machine.

SUMMARY OF THE INVENTION

In accordance with one embodiment of this invention, it is an object of this invention to provide an electromechanical press apparatus for trimming excess portions from a leadframe strip package having a semiconductor chip thereon and for forming leads of the leadframe strip package extending from the semiconductor chip.

It is another object of this invention to provide a method of operating an electromechanical press apparatus for trimming excess portions from a leadframe strip package having a semiconductor chip thereon and for forming leads of the leadframe strip package extending from the semiconductor chip.

It is a further object of this invention to provide an electromechanical press apparatus for use in the production of semiconductor packages that is of minimum size while providing maximum power.

It is a another object of this invention to provide an electromechanical press apparatus for use in the production of semiconductor packages that can be quickly and easily implemented with an in-line assembly process such that as there are variations in package size and in leadframe cutouts for different semiconductor devices, the apparatus has a high level of flexibility and a short change out time from one semiconductor device to another.

It is yet another object of this invention to provide an electromechanical press apparatus that can be used in the clean room environment associated with the production of semiconductor packages.

BRIEF DESCRIPTION OF THE PREFERRED EMBODIMENTS

In accordance with one embodiment of this invention, an electromechanical press apparatus for trimming excess portions from a leadframe strip package having a semiconductor chip thereon and for forming leads of the leadframe strip package extending from the semiconductor chip is disclosed comprising, in combination, means coupled to the leadframe strip package and having a portion thereof moving along a rectangular path of motion for linearly shifting a leadframe strip having at least one leadframe strip package thereon along a plane orthogonally oriented to the rectangular path of motion, and means coupled to the leadframe strip package and having a portion thereof moving along a line of motion orthogonally oriented to the plane for performing at least one of the trimming of the excess portions from the leadframe strip package and the forming of the leads of the leadframe strip package extending from the semiconductor chip. The means for performing the trimming and the forming includes a tool for executing at least one of the trimming and the forming operations, a drive member for the tool, and a lever connecting the drive member and the tool with one another and having two end portions. The lever is pivotally supported at one of the end portions and the drive member engages the lever at the other of the end portions, the tool being mounted on the lever at a location intermediate the end portions. In addition, this apparatus includes rotating means coupled to the means for linearly shifting the leadframe strip and to the means for performing the trimming and the forming for providing force for driving the means for linearly shifting the leadframe strip and the means for performing the trimming and the forming. This apparatus further includes coupling means coupled to the rotating means for transferring the force to a first shaft for driving the means for linearly shifting the leadframe strip and to a second shaft for driving the means for performing the trimming and the forming. The rotating means also includes control means for permitting controlled engagement and disengagement of the force from the rotating means to the coupling means. The first shaft of the apparatus is coupled to a first disc rotatable through at least one complete rotation in order to complete at least one corresponding cycle of the rectangular path of motion. Similarly, the second shaft of the apparatus is eccentrically coupled to a second disc rotatable through at least one complete rotation in order to perform at least one of the trimming of the excess portions from the leadframe strip package and the forming of the leads of the leadframe strip package extending from the semiconductor chip. The apparatus also includes leadframe transport means coupled to the means for linearly shifting the leadframe strip and to the means for performing the trimming and the forming for retaining the leadframe strip package. Another tool is coupled to the leadframe transport means and is arranged to cooperate with the tool of the means for performing the trimming and the forming in executing at least one of the trimming and the forming operations. Note that a plurality of the apparatus can be coupled together by a single shaft that is driven by a single electric motor, if desired.

In accordance with another embodiment of this invention, a method of operating an electromechanical press apparatus for trimming excess portions from a leadframe strip package having a semiconductor chip thereon and for forming leads of the leadframe strip package extending from the semiconductor chip is disclosed comprising the steps of providing means coupled to the leadframe strip package and having a portion thereof moving along a rectangular path of motion for linearly shifting a leadframe strip having at least one leadframe strip package thereon along a plane orthogonally oriented to the rectangular path of motion, and providing means coupled to the leadframe strip package and having a portion thereof moving along a line of motion orthogonally oriented to the plane for performing at least one of the trimming of the excess portions from the leadframe strip package and the forming of the leads of the leadframe strip package extending from the semiconductor chip. The means for performing the trimming and the forming includes a tool for executing at least one of the trimming and the forming operations, a drive member for the tool, and a lever connecting the drive member and the tool with one another and having two end portions. The lever is pivotally supported at one of the end portions and the drive member engages the lever at the other of the end portions, the tool being mounted on the lever at a location intermediate the end portions. This method further includes the step of providing rotating means coupled to the means for linearly shifting the leadframe strip and to the means for performing the trimming and the forming for providing force for driving the means for linearly shifting the leadframe strip and the means for performing the trimming and the forming. Also, this method includes the step of providing coupling means coupled to the rotating means for transferring the force to a first shaft for driving the means for linearly shifting the leadframe strip and to a second shaft for driving the means for performing the trimming and the forming. The rotating means further includes control means for permitting controlled engagement and disengagement of the force from the rotating means to the coupling means. The first shaft is coupled to a first disc rotatable through at least one complete rotation in order to complete at least one corresponding cycle of the rectangular path of motion. Analogously, the second shaft is eccentrically coupled to a second disc rotatable through at least one complete rotation in order to perform at least one of the trimming of the excess portions from the leadframe strip package and the forming of the leads of the leadframe strip package extending from the semiconductor chip. This method also includes the step of providing leadframe transport means coupled to the means for linearly shifting the leadframe strip and to the means for performing the trimming and the forming for retaining the leadframe strip package. In addition, this method further includes the step of providing another tool coupled to the leadframe transport means and arranged to cooperate with the tool of the means for performing the trimming and the forming in executing at least one of the trimming and the forming operations.

The foregoing and other objects, features, and advantages of the invention will be apparent from the following, more particular, description of the preferred embodiments of the invention, as illustrated in the accompanying drawings.

DESCRIPTION OF THE PREFERRED EMBODIMENTS

Figure 1:
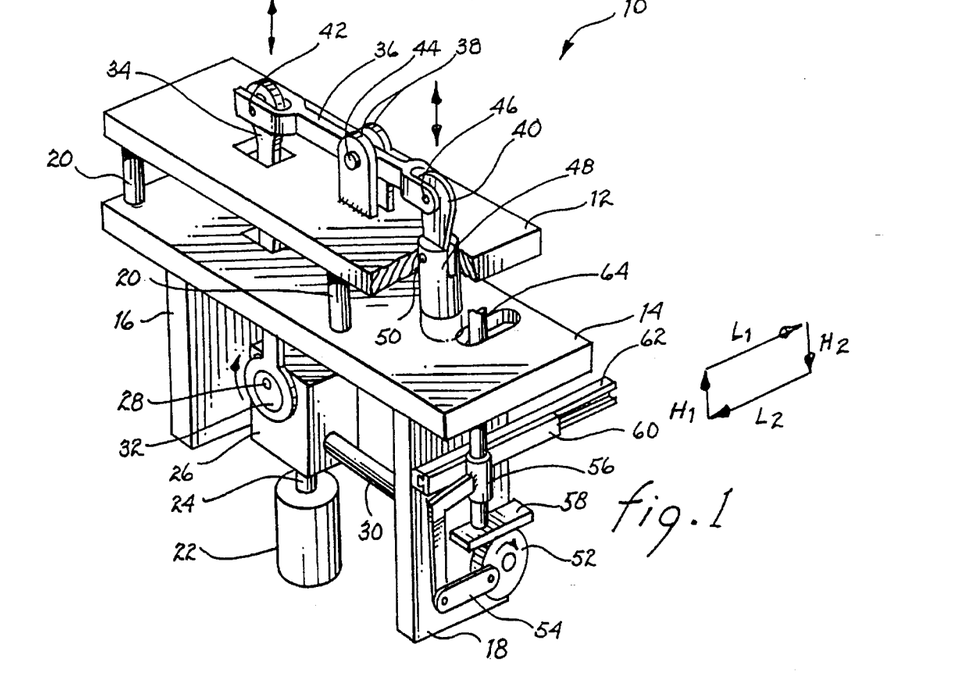
FIG. 1 is a perspective view of one embodiment of the electromechanical press apparatus.

Referring to FIG. 1, one embodiment of the electromechanical press apparatus is shown and is generally designated by reference number 10. Support for the apparatus 10 is provided by an upper support plate 12, a lower support plate 14, and side support plates 16 and 18. The upper support plate 12 is separated from the lower support plate 14 by vertical supports 20. An electric motor 22 is used to drive the motion of a leadframe strip as well as to drive the trimming or forming operation to be performed. The motor shaft 24 is connected to a 90 degree gear box 26 for driving two orthogonally oriented shafts 28 and 30 extending from the 90 degree gear box 26. The electric motor 22 is provided with an internal clutch mechanism such as a one-stroke clutch. The internal clutch mechanism is disengaged to allow the rotor of the motor 22 to rotate freely, thereby preserving the rotational inertia associated with the rotating rotor. When external control signals cause the internal clutch mechanism to engage, the rotational force supplied by the electric motor 22 is coupled to the 90 degree gear box 26 via the motor shaft 24 in order to drive the two shafts 28 and 30 so that they may perform their respective functions. The advantage of having the electric motor 22 with an internal clutch mechanism is that the rotational velocity of the motor 22 is, in a sense, conserved when the clutch is disengaged such that at the instant when the clutch is engaged and power is required to perform a trimming or forming operation, the motor 22 is already up to steady-state velocity.

When the shaft 30 is engaged by the engagement of the internal clutch mechanism of the motor 22, the shaft 30 rotates the disc 52 to complete one revolution. The disc 52 is coupled via the connecting member 54 to a guide bush 56. The guide bush 56 rests on a mechanical stop 58. In addition, the guide bush 56 is coupled to a guide rail 60 that slides along a guide rail retainer 62. The connecting rod 64 is also coupled to the guide bush 56. The lower support plate 14 is provided with a slot through which the connecting rod 64 is constrained.

With the connecting rod 64 in a position as shown in FIG. 1, when the disc 52 begins to rotate as shown in the clockwise direction, the guide bush 56 and the connecting rod 64 move upward in a motion similar to H1. As the connecting rod 64 reaches the top of the H1 motion and as the disc 52 continues to rotate, the connecting rod 64 begins the L1 movement as the guide rail 60 moves to the right along the guide rail retainer 62. At the end of the L1 movement, the connecting rod 64 moves down along the H2 movement as the guide bush 56 is pulled down due to the motion of the disc 52. As the disc 52 completes one revolution, the guide rail 60 moves to the left along the guide rail retainer 62, thus moving the connecting rod 64 along the L2 movement. In short, the circular motion associated with the single rotation of the disc 52 is transformed via the interaction of the connecting member 54, the guide bush 56, the mechanical stop 58, the guide rail retainer 62, and the guide rail 60 into the rectangular motion H1, L1, H2, and L2 of the connecting rod 64.

Alternatively, when the axis 28 is engaged by the engagement of the internal clutch mechanism of the motor 22, the axis 28 rotates the disc 32 to complete one revolution. Note that the disc 32 is eccentrically coupled to the axis 28. It is this eccentric connection at the axis 28 that causes a linear downward stroke followed by a linear upward stroke of the drive member 34 which is coupled to the disc 32. The drive member 34 is connected to a lever 36 at the connection 42. The lever 36 is coupled to a support portion 38 at the connection 44 and to a plunger interface 40 at the connector 46 located intermediate the connecting 42 and 44. The plunger interface 40 is coupled to a plunger 48 at the connector 50. The plunger 48 is coupled to an upper tool 48a for performing the trimming or the forming operation on the leadframe strip against a lower tool (not shown). The linear upward and downward motion of the drive member 34 is transferred via the lever 36 which oscillates about the connection 44 to a corresponding linear downward and upward motion of the plunger 48 with the associated tool 48a in order to perform the trimming or the forming operation.

Figure 2:
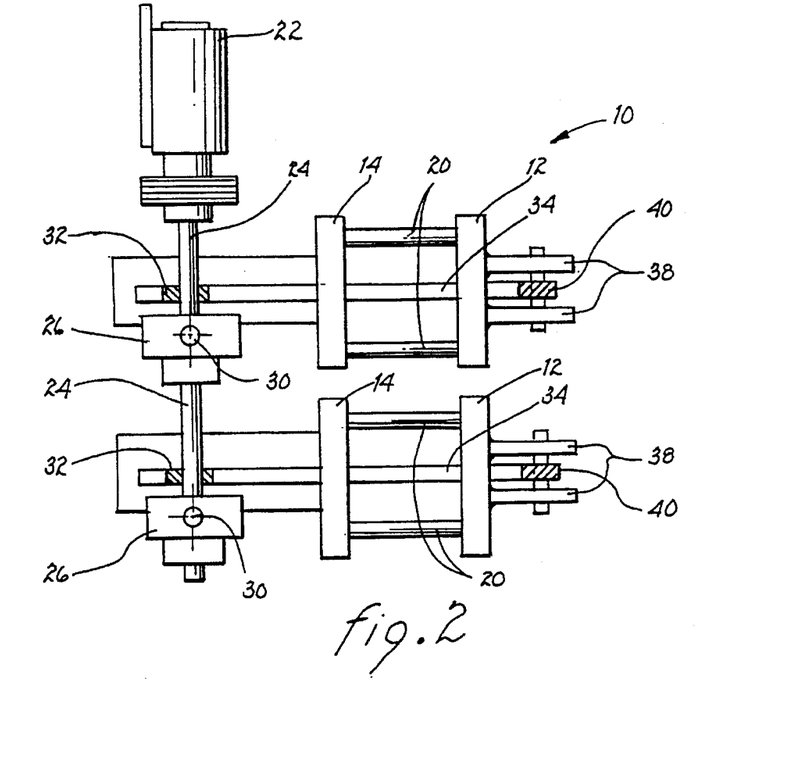
FIG. 2 is a simplified cross sectional view of another embodiment showing two of the electromechanical press apparatus coupled together in a sequential manner by a single shaft driven by a single electric motor.

Referring to FIG. 2, a cross sectional view of another embodiment shows two of the electromechanical press apparatus 10 coupled together in a sequential manner by a single shaft 24 driven by a single electric motor 22. The electric motor 22 is used to drive the motion of a leadframe strip as well as to drive the trimming or forming operation to be performed. The motor shaft 24 is connected to two 90 degree gear boxes 26 that are each used to drive two orthogonally oriented shafts 24 and 30 extending from the 90 degree gear boxes 26. Note that this embodiment of the apparatus 10 differs from the embodiment of the apparatus 10 shown in FIG. 1 in that the motor shaft 24 is not only driven by the motor 22, but it is also directly used to drive the eccentrically coupled discs 32. As in the previous embodiment, the eccentrically coupled discs 32 cause the linear downward stroke followed by the linear upward stroke of the drive members 34 which are coupled to the discs 32, and this motion of the drive members 34 drives the plunger with the associated upper tool (not shown) in order to perform the trimming or forming operation. Note that each of the 90 degree gear boxes 26 has the shaft 30 which, as previously described, drives the rectangular motion of the connecting rod 64. The upper support plate 12 and the lower support plate 14 are separated by the vertical supports 20. Also, note the support portion 38 and the plunger interface 40 on the upper support plate 12. If desired, any number of the apparatus 10 can be coupled together in a serial manner to provide a bank of such apparatus 10 for performing a plurality of trim and form operations on a leadframe strip.

Figure 3:
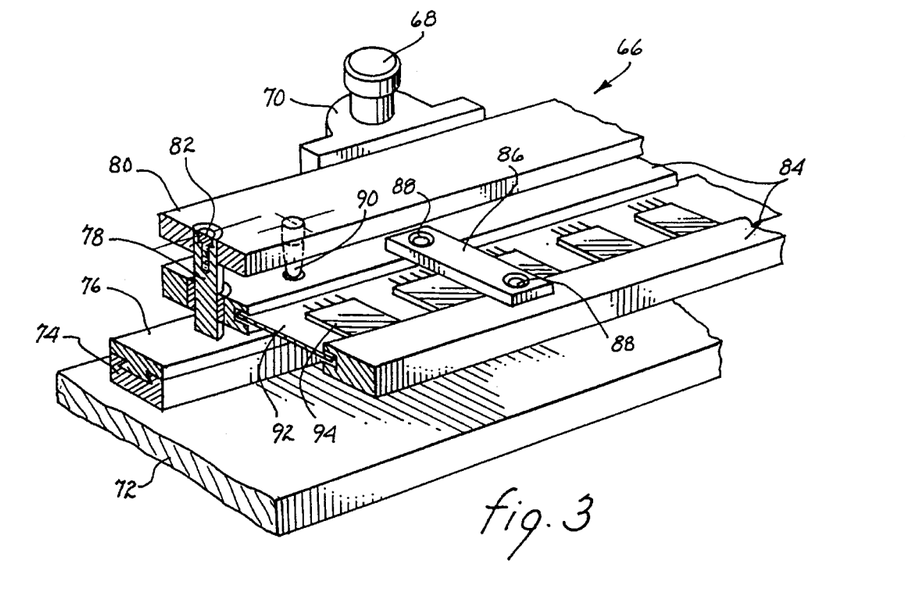
FIG. 3 is a perspective view of the leadframe strip transport device that is used in conjunction with both of the embodiments of the electromechanical press apparatus shown in FIGS. 1 and 2.
Figure 4:
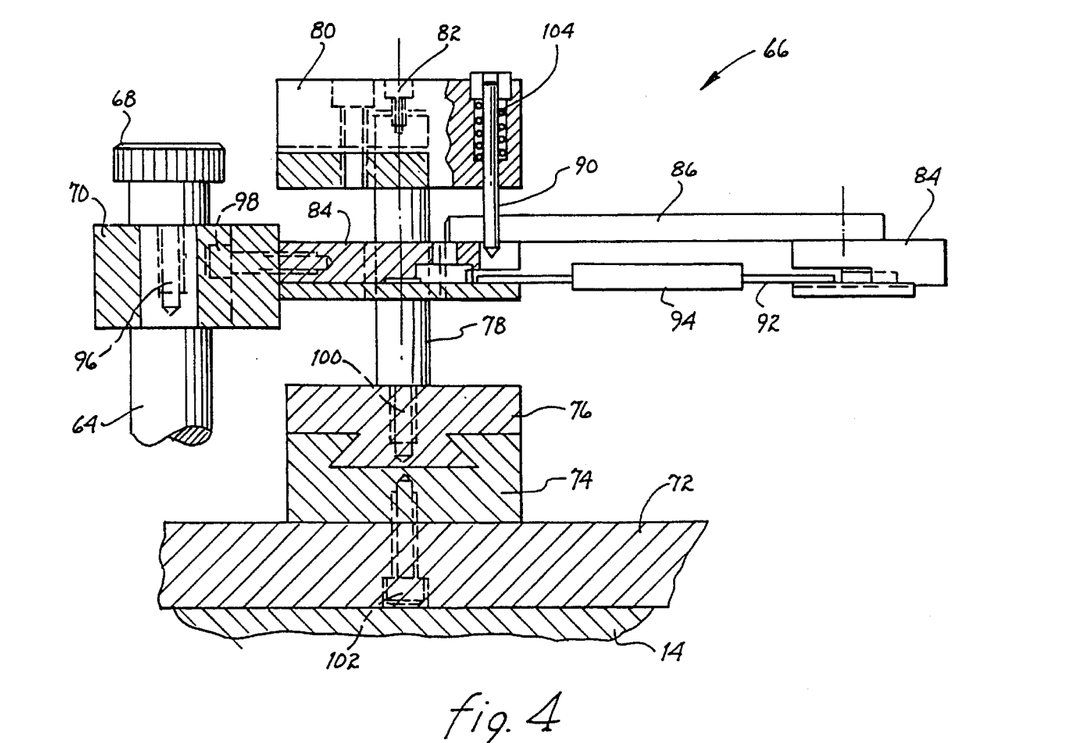
FIG. 4 is a cross sectional view of the leadframe strip transport device shown in FIG. 3.

Referring to FIGS. 3 and 4, a leadframe strip transport device is shown and is generally designated by reference number 66. The connecting rod 64 is coupled to the connecting rod knob 68 through the leadframe strip guide rail interface 70 by the connector 96. The leadframe strip guide rail interface 70 is coupled to the leadframe strip guide rail 84 by the connector 98. A bottom tool 72 is coupled to the lower support plate 14. The guide member 74 is fixedly coupled to the bottom tool 72 by the connector 102, and the member 76 is slideably coupled to the guide member 74. A guide shaft 78 is fixed to the members 76 and 80 by connectors 100 and 82, respectively. The guide shaft 78 also passes through a hole in the leadframe strip guide rail 84. Note that the leadframe strip guide rail 84 is held together by the member 86 with the associated connectors 88. A slot is formed in the leadframe strip guide rail 84 for retaining the leadframe strip 92 including semiconductor packages 94. The member 80 is provided with a transport pin 90 that is spring loaded by the spring 104.

Referring to FIGS. 1–4, when the connecting rod 64 moves upward along the H1 path of motion, the leadframe strip guide rail interface 70 moves the leadframe strip guide rail 84 upward. Note that since the members 76 and 80 are not connected to the leadframe strip guide rail interface 70, these members 76 and 80 do not move upward. As the leadframe strip guide rail 84 moves upward, the transport pin 90 passes through a hole in the leadframe strip guide rail 84 and into a hole (not shown) in the leadframe strip 92 itself. The connecting rod 64 then moves along the L1 path of motion, thereby moving the member 76, the guide shaft 78, the leadframe strip guide rail 84, the member 80, and the leadframe strip 92 along the L1 path of motion. When the connecting rod 64 moves along the H2 path of motion, the leadframe strip guide rail 84 also moves downward to disengage the transport pin 90 from both the leadframe strip 92 and the leadframe strip guide rail 84. After completing the H1, L1, and H2 movements, the plunger 48 with the associated upper tool 48a moves down to perform the required trimming or forming operation on the combined leadframe strip 92 and semiconductor package 94 against the bottom tool 72. As the leadframe strip 92 and the semiconductor package 94 are, in effect, held in place between the upper tool 48a and the bottom tool 72, the connecting rod 64 moves back along the L2 path of motion to move the member 76, the guide shaft 78, the leadframe strip guide rail 84, and the member 80 back to their original locations. Of course, the grip on the leadframe strip 92 is no longer required to hold the strip in place once the member 76, the guide shaft 78, the leadframe strip guide rail 84, and the member 80 are back to their original locations, therefore, the plunger 48 moves back up to release the leadframe strip 92. This synchronized cycle of performing a trimming or a forming operation and shifting to the next portion of the leadframe strip 92 and associated semiconductor package 94 to be worked on is repeatedly executed in order to perform the required operation on the entire length of the leadframe strip 92 with the associated semiconductor packages 94.

OPERATION OF THE APPARATUS OF FIGS. 1–4

Referring to FIGS. 1–4, when the shaft 30 is engaged by the engagement of the internal clutch of the motor 22, the shaft 30 rotates the disc 52 to complete one revolution. When the disc 52 begins to rotate in the clockwise direction, the guide bush 56 and the connecting rod 64 move upward in a motion similar to H1. As the connecting rod 64 reaches the top of the H1 motion and as the disc 52 continues to rotate, the connecting rod 64 begins the L1 movement as the guide rail 60 moves to the right along the guide rail retainer 62. At the end of the L1 movement, the connecting rod 64 moves down along the H2 movement as the guide bush 56 is pulled down due to the motion of the disc 52. As the disc 52 completes one revolution, the guide rail 60 moves to the left along the guide rail retainer 62, thus moving the connecting rod 64 along the L2 movement.

When the connecting rod 64 moves upward along the H1 path of motion, the leadframe strip guide rail interface 70 moves the leadframe strip guide rail 84 upward. As the leadframe strip guide rail 84 moves upward, the transport pin 90 passes through a hole in the leadframe strip guide rail 84 and into a hole (not shown) in the leadframe strip 92 itself. The connecting rod 64 then moves along the L1 path of motion, thereby moving each of the member 76, the guide shaft 78, the leadframe strip guide rail 84, the member 80, and the leadframe strip 92 along the L1 path of motion. When the connecting rod 64 moves downward H2, the leadframe strip guide rail 84 also moves downward to disengage the transport pin 90 from both the leadframe strip 92 and the leadframe strip guide rail 84. After completing the H1, L1, and H2 movements, the plunger 48 and the associated upper tool 48a move down to perform the required trimming or forming operation on the leadframe strip 92 against the bottom tool 72 in the following manner.

Figures 5, 6:
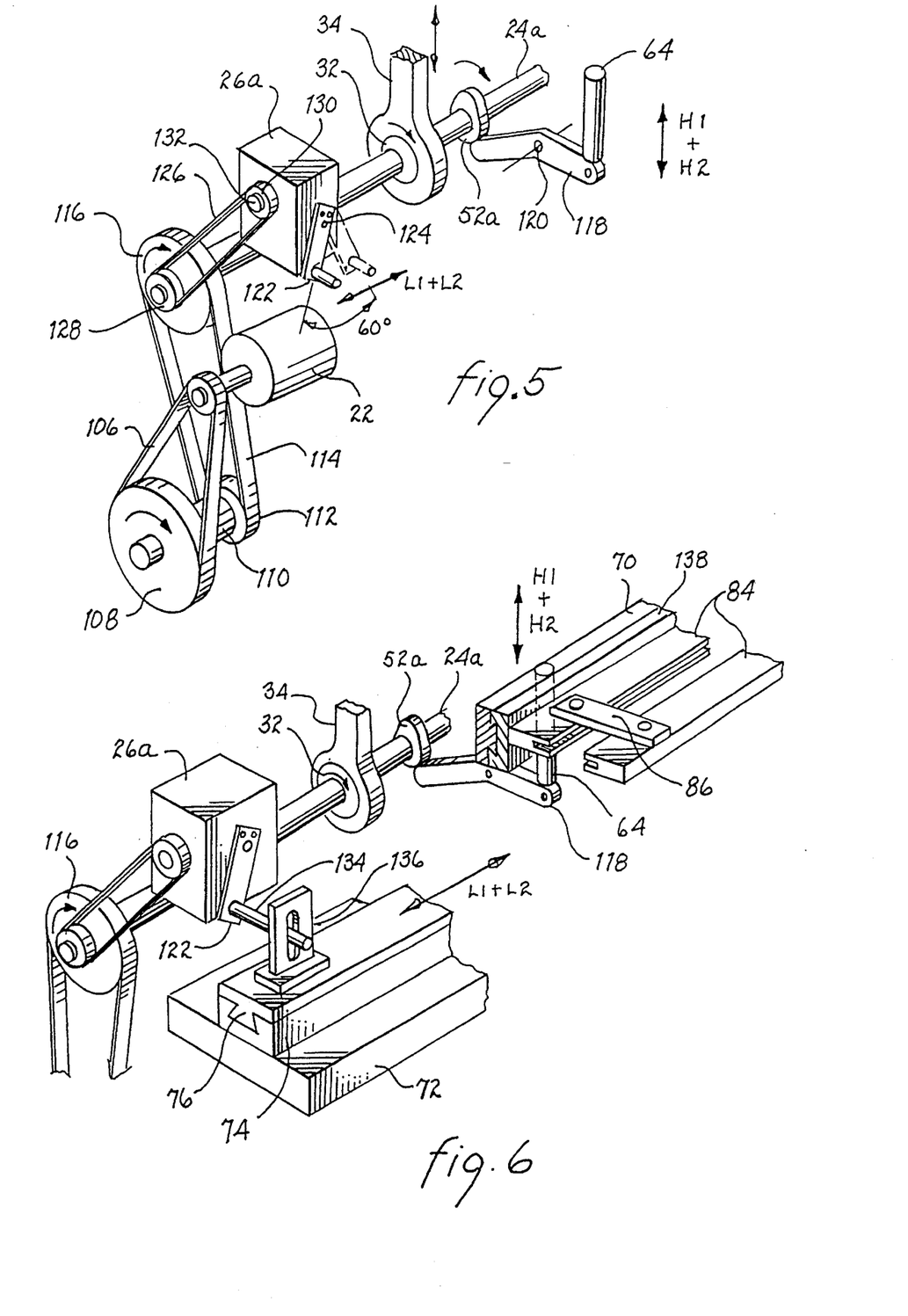
FIG. 5 is a perspective view of a further embodiment of a drive assembly for the electromechanical press apparatus.
FIG. 6 illustrates details of the connection between the drive assembly of FIG. 5 and a leadframe strip transport device.

Another embodiment of a drive assembly for the electromechanical press apparatus 10 is shown in FIG. 5. Here, the electric motor 22 drives a belt 106 which passes around a flywheel 108. The flywheel 108 is connected to an electrically controlled clutch mechanism 110 which constitutes a safety mechanism. The clutch mechanism 110 carries a wheel 112 which drives a belt 114. The belt 114 passes around a wheel 116 which is mounted on a main shaft 24a.

The main shaft 24a carries the eccentric disc 32 which moves the drive member 34 and the tool 48a up-and-down. The main shaft 24a also carries a second eccentric disc 52a which is connected to a lever 118 having two arms which articulate relative to one another about a pivot 120. The lever 118 is pivotally coupled to the connecting rod 64 so that the eccentric disc 52a can linearly reciprocate the connecting rod 64 in a vertical direction and cause the connecting rod 64 to undergo the H1 and H2 motions.

The L1 and L2 motions are achieved by means of a crank 122 which is mounted on a shaft 124 projecting from a gear box 26a. The gear box 26a is designed to pivot the crank 122 back-and-forth through a predetermined angle, e.g., an angle of 60 degrees as shown. The gear box 26a is driven by the main shaft 24a through the agency of a belt 126 which passes around a wheel 128 on one end of the main shaft 24a and a wheel 130 on a shaft 132 of the gear box 26a.

The main shaft 24a can drive several of the electromechanical press apparatus 10. As in the other embodiments, there is full synchronization of the trimming or forming operation and the leadframe transport.

Figure 7:
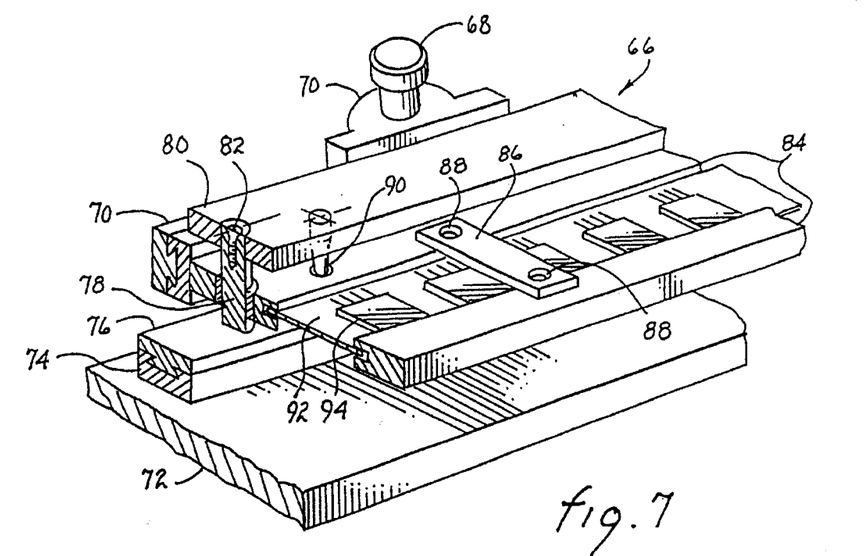
FIG. 7 is similar to FIG. 3 but shows an embodiment of the leadframe strip transport device which is adapted to the drive assembly of FIG. 5.
Figure 8:
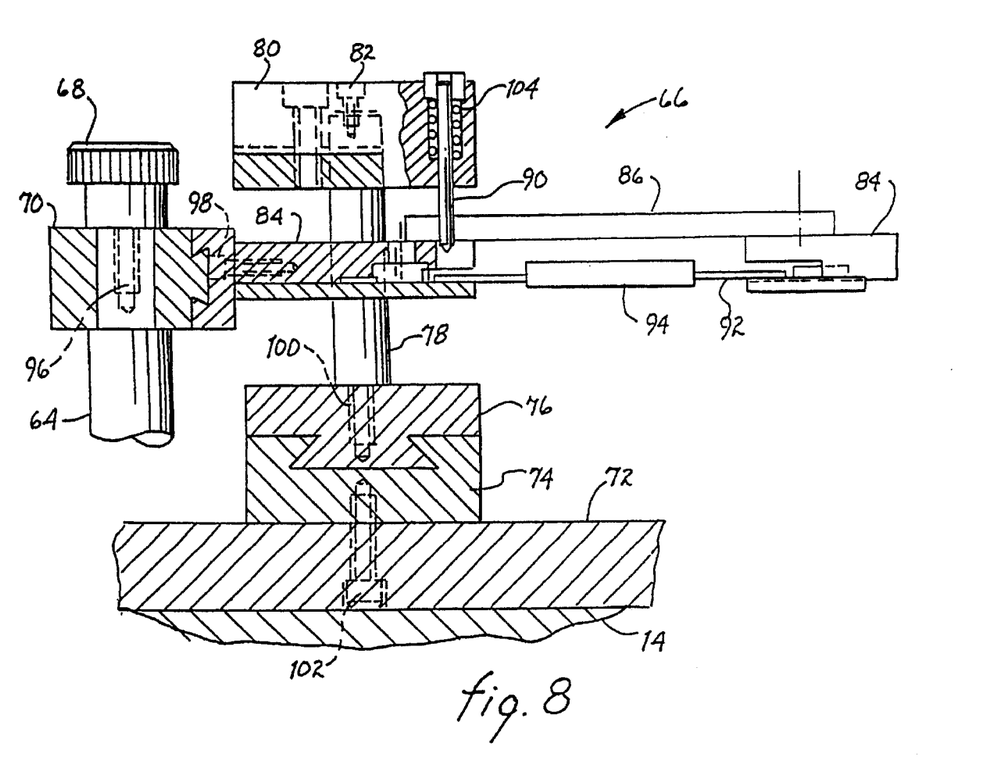
FIG. 8 is a cross sectional view of the leadframe strip transport device shown in FIG. 7.

Referring to FIGS. 6, 7 and 8, the crank 122 is provided with a shaft 134 which carries a leadframe strip sliding member interface 136. The leadframe strip sliding member interface 136 is coupled to the member 76 by a connector (not shown).

The leadframe strip guide rail interface 70 here performs a function similar to the guide member 74. Thus, the leadframe strip guide rail interface 70 is extended so that a member 138 can be slideably coupled to the leadframe strip guide rail interface 70. The member 138 is located between the leadframe strip guide rail interface 70 and the leadframe strip guide rail 84 and is coupled to the leadframe strip guide rail 84 by the connector 98.

When the connecting rod 64 moves upward along the H1 path of motion, the leadframe strip guide rail interface 70 moves the member 138 and the leadframe strip guide rail 84 upward. Since the members 76, 136 and 80 are not connected to the leadframe strip guide rail interface 70, these members 76, 136 and 80 do not move upward. As the leadframe strip guide rail 84 moves upward, the transport pin 90 passes through the previously mentioned hole in the leadframe strip guide rail 84 and into a hole (not shown) in the leadframe strip 92 itself. The member 76 then moves along the L1 path of motion thereby moving the guide shaft 78, the leadframe strip guide rail 84, the member 80, the member 138, and the leadframe strip 92 along the L1 path of motion. Note that the connecting rod 64 does not move along the L1 path of motion because the member 138 slides relative to the leadframe strip guide rail interface 70 which is fixed to the connecting rod 64. When the connecting rod 64 moves along the H2 path of motion, the leadframe strip guide rail 84 also moved downward to disengage the transport pin 90 from both the leadframe strip 92 and the leadframe strip guide rail 84. After completing the H1, L1 and H2 movements, the plunger 48 with the associated upper tool 48a moves down to perform the required trimming or forming operation on the combined leadframe strip 92 and semiconductor package 94 against the bottom tool 72. As the leadframe strip 92 and the semiconductor package 94 are, in effect, held in place between the upper tool 48a and the bottom tool 72, the member 76 moves back along the L2 path of motion to move the guide shaft 78, the leadframe strip guide rail 84, the member 80, and the member 138 back to their original locations. The grip on the leadframe strip 92 is no longer required to hold the strip 92 in place once the member 76, the guide shaft 78, the leadframe strip guide rail 84, the member 80, and the member 138 are back to their original locations. Therefore, the plunger 48 moves back up to release the leadframe strip 92. This synchronized cycle of performing a trimming or a forming operation and shifting to the next portion of the leadframe strip 92 and associated semiconductor package 94 is repeatedly executed in order to perform the required operation on the entire length of the leadframe strip 92 with the associated semiconductor packages 94.

OPERATION OF THE APPARATUS OF FIGS. 5–8

Referring to FIGS. 5–8, when the main shaft 24a is engaged by the engagement of the clutch mechanism 110, the main shaft 24a rotates the disc 52a to complete one revolution and causes the crank 122 to pivot back-and-forth through its range of motion. When the disc 52a begins to rotate in the clockwise direction, the lever 118 moves upward thereby moving the connecting rod 64 upward in a motion similar to H1. As the connecting rod 64 approaches the top of the H1 motion, the lever 118, which was originally bent, begins to straighten. Furthermore, the crank 122 pivots counterclockwise so that the leadframe strip sliding member interface 136 begins the L1 movement and slides the member 76 to the right along the guide member 74. At the end of the L1 movement, the connecting rod 64 moves down along the H2 movement as the lever 118 is pulled down due to the motion of the disc 52a. The lever 118 reaches its maximum length and then begins to shorten during the H2 motion of the connecting rod 64. As the disc 52a completes one revolution, the crank 122 pivots Clockwise thus moving the leadframe strip sliding member interface 136 along the L2 movement.

When the connecting rod 64 moves upward along the H1 path of motion, the leadframe strip guide rail interface 70 moves the leadframe strip guide rail 84 upward. As the leadframe strip guide rail 84 moves upward, the transport pin 90 passes through the abovementioned hole in the leadframe strip guide rail 84 and into a hole (not shown) in the leadframe strip 92 itself. The leadframe strip sliding member interface 136 then moves along the L1 path of motion thereby moving each of the member 76, the guide shaft 78, the member 80, the member 138, the leadframe strip guide rail 84 and the leadframe strip 92 along the L1 path of motion. When the connecting rod 64 moves downward along H2, the leadframe strip guide rail 84 also moves downward to disengage the transport pin 90 from both the leadframe strip 92 and the leadframe strip guide rail 84.

After completion of the H1, L1 and H2 movements, the plunger 48 and the associated upper tool 48a move down to perform the required trimming or forming operation on the leadframe strip 92 against the bottom tool 72 in the following manner:

When the motor shaft 24a is engaged by the engagement of the clutch mechanism 110, the motor shaft 24a rotates the disc 32 to complete one revolution. The disc 32 is eccentrically connected to the motor shaft 24a so that the rotation of the disc 32 causes the drive member 34 to move linearly upward and linearly downward. The linear upward and downward motion of the drive member 34 is transferred via the lever 36 which oscillates about the connection 44 to a corresponding linear downward and upward motion of the plunger 48 with the associated upper tool 48a to perform the trimming or the forming operation. The force on the leadframe strip 92 provided by the upper tool 48a moving down toward the bottom tool 72 executes the desired trimming or forming operation.

Since the leadframe strip 92 and semiconductor package 94 are, in effect, held in place by the upper tool 48a and the bottom tool 72, the leadframe strip sliding member interface 136 moves back along the L2 path of motion to move each of the member 76, the guide shaft 78, the member 80, the member 138, and the leadframe strip guide rail 84 back to their original locations. This synchronized cycle of performing a trimming or a forming operation and shifting to the next portion of the leadframe strip 92 and associated semiconductor package 94 is repeatedly executed in order to perform the required operation on the entire length of the leadframe strip 92 with the associated semiconductor packages 94.

When the axis 28 is engaged by the engagement of the internal clutch of the motor 22, the axis 28 rotates the disc 32 to complete one revolution. The disc 32 is eccentrically connected to the axis 28, therefore, the rotation of the disc 32 causes the drive member 34 to move linearly upward and linearly downward. The linear upward and downward motion of the drive member 34 is transferred via the lever 36 which oscillates about the connection 44 to a corresponding linear downward and upward motion of the plunger 48 with the associated upper tool 48a to perform the trimming or the forming operation. The force on the leadframe strip 92 provided by the upper tool moving down toward the bottom tool 72 executes the desired trimming or forming operation.

Since the leadframe strip 92 and semiconductor package 94 are, in effect, held in place by the upper tool and the bottom tool 72, the connecting rod 64 moves back along the L2 path of motion to move each of the member 76, the guide shaft 78, the leadframe strip guide rail 84, and the member 80 back to their original locations. This synchronized cycle of performing a trimming or a forming operation and shifting to the next portion of the leadframe strip 92 and associated semiconductor package 94 to be worked on is repeatedly executed in order to perform the required operation on the entire length of the leadframe strip 92 with the associated semiconductor packages 94.

While the invention has been particularly shown and described with reference to the preferred embodiments thereof, it will be understood by those skilled in the art that the foregoing and other changes in form and details may be made therein without departing from the spirit and scope of the invention. The unique arrangement of the elements of the apparatus 10 allows the apparatus 10 to be of minimum size while maintaining maximum press power. For example, the width of the apparatus 10 can be as small as approximately 10 inches wide while providing a press capacity of approximately 6 metric tons.

Moreover, the apparatus 10 can be divided into a drive unit and one or more press units which respectively constitute discrete modules. If desired, two or more press units can be connected by a common shaft which is driven by a single drive unit. Such a modular construction allows the number of press units to be adjusted to the order volume and permits a malfunctioning press unit or drive unit to be replaced. The apparatus 10 can also include a modular electronic control unit for computer control of the drive unit. It is further possible to replace the 90 degree gear box 26 with an arrangement of belts and pulleys.

What is claimed is:

1. An electromechanical press apparatus for trimming excess portions from a leadframe strip package having a semiconductor chip thereon and for forming leads of said leadframe strip package extending from said semiconductor chip comprising, in combination:

means coupled to said leadframe strip package and having a portion thereof moving along a rectangular path of motion for linearly shifting a leadframe strip having at least one leadframe strip package thereon along a plane orthogonally oriented to said rectangular path of motion; and  means coupled to means for linearly shifting said leadframe strip and having a portion thereof moving along a line of motion orthogonally oriented to said plane for performing at least one of said trimming of said excess portions from said leadframe strip package and said forming of said leads of said leadframe strip package extending from said semiconductor chip,  said means for performing said trimming and said forming including a tool for executing at least one of said trimming and said forming operations, a drive member for said tool, and a lever connecting said drive member and said tool with one another and having two end portions, said lever being pivotally supported at one of said end portions and said drive member engaging said lever at a location intermediate said portions.

2. The apparatus of claim 1 further including rotating means coupled to said means for linearly shifting said leadframe strip and to said means for performing said trimming and said forming for providing force for driving said means for linearly shifting said leadframe strip and said means for performing said trimming and said forming.

3. The apparatus of claim 2 further including coupling means coupled to said rotating means for transferring said force to a first shaft for driving said means for linearly shifting said leadframe strip and to a second shaft for driving said means for performing said trimming and said forming.

4. The apparatus of claim 3 wherein said rotating means further includes control means for permitting controlled engagement and disengagement of said force from said rotating means to said coupling means.

5. The apparatus of claim 3 wherein said first shaft is coupled to a disc rotatable through at least one complete rotation in order to complete at least one corresponding cycle of said rectangular path of motion.

6. The apparatus of claim 3 wherein said second shaft is eccentrically coupled to a disc rotatable through at least one complete rotation in order to perform at least one of said trimming of said excess portions from said leadframe strip package and said forming of said leads of said leadframe strip package extending from said semiconductor chip.

7. The apparatus of claim 1 further including leadframe transport means coupled to said means for linearly shifting said leadframe strip and to said means for performing said trimming and said forming for retaining said leadframe strip package.

8. The apparatus of claim 7 further including another tool coupled to said leadframe transport means and arranged to cooperate with said tool of said means for performing said trimming and said forming for executing at least one of said trimming and said forming operations.

9. The apparatus of claim 1 wherein a plurality of said apparatus are coupled together by a single shaft that is driven by a single electric motor.

10. The apparatus of claim 1 wherein said means for linearly shifting said leadframe strip includes a linearly reciprocable member and a pivotally reciprocable member.

11. A method of operating an electromechanical press apparatus for trimming excess portions from a leadframe strip package having a semiconductor chip thereon and for forming leads of said leadframe strip package extending from said semiconductor chip comprising the steps of:

providing means coupled to said leadframe strip package and having a portion thereof moving along a rectangular path of motion for linearly shifting a leadframe strip having at least one leadframe strip package thereon along a plane orthogonally oriented to said rectangular path of motion; and providing means coupled to means for linearly shifting said leadframe strip and having a portion thereof moving along a line of motion orthogonally oriented to said plane for performing at least one of said trimming of said excess portions from said leadframe strip package and said forming of said leads of said leadframe strip package extending from said semiconductor chip, said means for performing said trimming and said forming including a tool for executing at least one of said trimming and said forming operations, a drive member for said tool, and a lever connecting said drive member and said tool with one another and having two end portions, said lever being pivotally supported at one of said end portions and said drive member engaging said lever at the other of said end portions, said tool being mounted on said lever at a location intermediate said end portions.

12. The method of claim 11 further including the step of providing rotating means coupled to said means for linearly shifting said leadframe strip and to said means for performing said trimming and said forming for providing force for driving said means for linearly shifting said leadframe strip and said means for performing said trimming and said forming.

13. The method of claim 12 further including the step of providing coupling means coupled to said rotating means for transferring said force to a first shaft for driving said means for linearly shifting said leadframe strip and to a second shaft for driving said means for performing said trimming and said forming.

14. The method of claim 13 wherein said rotating means further includes control means for permitting controlled engagement and disengagement of said force from said rotating means to said coupling means.

15. The method of claim 12 wherein said first shaft is coupled to a disc rotating through at least one complete rotation in order to complete at least one corresponding cycle of said rectangular path of motion.

16. The method of claim 13 wherein said second shaft is eccentrically coupled to a disc rotatable through at least one complete rotation in order to perform at least one of said trimming of said excess portions from said leadframe strip package and said forming of said leads of said leadframe strip package extending from said semiconductor chip.

17. The method of claim 12 wherein a plurality of said apparatus are coupled together by a single shaft that is driven by a single electric motor.

18. The method of claim 12 wherein said means for linearly shifting said leadframe strip includes a linearly reciprocable member and a pivotally reciprocable member.

19. The method of claim 11 further including the step of providing leadframe transport means coupled to said means for linearly shifting said leadframe strip and to said means for performing said trimming and said forming for retaining said leadframe strip package.

20. The method of claim 19 further including the step of providing anther tool coupled to said leadframe transport means and arranged to cooperate with said tool of said means for performing said trimming and said forming in executing at least one of said trimming and said forming operations.

* * * * *